(12) United States Patent
Vishnyakov et al.

(10) Patent No.: US 8,388,862 B2
(45) Date of Patent: *Mar. 5, 2013

(54) INORGANIC LUMINESCENT MATERIAL FOR SOLID-STATE WHITE-LIGHT SOURCES

(76) Inventors: Anatoly Vasilyevich Vishnyakov, Moscow (RU); Dmitry Juryevich Sokolov, Moskovskaya Oblast (RU)

( * ) Notice: Subject to any disclaimer, the term of this patent is extended or adjusted under 35 U.S.C. 154(b) by 0 days.

This patent is subject to a terminal disclaimer.

(21) Appl. No.: 13/148,723

(22) PCT Filed: Jul. 28, 2009

(86) PCT No.: PCT/RU2009/000374
§ 371 (c)(1),
(2), (4) Date: Aug. 10, 2011

(87) PCT Pub. No.: WO2011/014091
PCT Pub. Date: Feb. 3, 2011

(65) Prior Publication Data
US 2011/0309302 A1 Dec. 22, 2011

(51) Int. Cl.
*C09K 11/08* (2006.01)
(52) U.S. Cl. .................................. 252/301.4 R
(58) Field of Classification Search ........... 252/301.4 R, 252/301.4 F
See application file for complete search history.

(56) References Cited

U.S. PATENT DOCUMENTS

| | | | |
|---|---|---|---|
| 3,564,322 A | 2/1971 | Blasse | |
| 5,998,925 A | 12/1999 | Shimizu et al. | |
| 6,069,440 A | 5/2000 | Shimizu et al. | |
| 6,608,332 B2 | 8/2003 | Shimizu et al. | |
| 6,614,179 B1 | 9/2003 | Shimizu et al. | |
| 6,630,077 B2 | 10/2003 | Shiang et al. | |
| 7,135,129 B2 | 11/2006 | Naum et al. | |
| 7,362,048 B2 | 4/2008 | Shimizu et al. | |
| 2007/0272899 A1 | 11/2007 | Naum | |
| 2007/0278451 A1* | 12/2007 | Naum | 252/301.4 F |
| 2008/0116422 A1 | 5/2008 | Naum et al. | |
| 2008/0246005 A1 | 10/2008 | Naum et al. | |
| 2008/0290355 A1 | 11/2008 | Naum et al. | |
| 2009/0153027 A1* | 6/2009 | Naum et al. | 313/503 |
| 2009/0195142 A1* | 8/2009 | Song et al. | 313/483 |

FOREIGN PATENT DOCUMENTS

| | | |
|---|---|---|
| CN | 1818016 | 8/2006 |
| TW | 200823277 | 11/2006 |

OTHER PUBLICATIONS

English Abstract of CN1818016.
English Abstract of TW200823277.
English Abstract of Kong Literature Reference.
Kong, L. et al., "Effects of Doping Lanthanide Ions in YAG: Ce System on the Spectral Probe of Ce3+," Chemical Journal of Chinese Universities, 29(4), pp. 673-676, (2008).
Soschin, N. P. et al., "Warm White Light-Emitting Diodes Based on P-N-Heterostructures InGaN/AlGaN/GaN Coated by Yttrium-Gadolinium Garnet Phosphors," Physics and Technology, 2009, vol. 43, Issue 5, pp. 700-703.

* cited by examiner

*Primary Examiner* — Emily Le
*Assistant Examiner* — Lynne Edmondson
(74) *Attorney, Agent, or Firm* — Preston Smirman; Smirman IP Law, PLLC

(57) ABSTRACT

InGaN-based blue LEDs and, specifically luminescent materials, are described containing yttrium oxide, oxides of rare earth metals, as well as aluminium oxide in proportions that yield a luminescent material whose average composition fits the general formula $(Y_{1-x-y}Ce_x\Sigma Ln_y)_{3+\alpha}Al_5O_{12+1.5\alpha}$, where $\alpha$—defines increase in stoichiometric index over the known value for yttrium-gadolinium garnet and varies between 0.033 and 2; x—is atomic fraction of cerium, 0.0001-0.1; $\Sigma Ln_y$ —is one or more lanthanides from the Gd, Tb, La, Yb group, whose atomic fraction in an yttrium sub-lattice is $0.01<Gd<0.70$; $0.001<Tb<0.2$; $0.001<La<0.1$; $0.001<Yb<0.1$, respectively, while the difference for all the compositions $[1-x-y]>0$.

2 Claims, No Drawings

INORGANIC LUMINESCENT MATERIAL FOR SOLID-STATE WHITE-LIGHT SOURCES

CROSS-REFERENCE TO RELATED APPLICATION

The instant application is a national phase of, and claims priority to, PCT International Application No. PCT/RU2009/000374, filed on Jul. 28, 2009, pending, the entire specification of which is expressly incorporated herein by reference.

The present invention pertains to the field of lighting technology and specifically to luminescent materials that emit light in the yellow-orange area of the spectrum when excited by blue light. These materials are used in solid-state white-light sources in which intense white luminescence is obtained by combining a yellow-orange phosphor with primary blue emission generated by an InGaN-based blue LED (in the 440-480 nm area of the spectrum). In recent years, high-efficiency white-light sources have been built based on these devices, with light efficacy of up to 150 lumens per watt, which is over 10 times more than the light efficacy of incandescent lamps and almost twice that of gas-discharge light sources. It is widely held that current developments in solid-state white-light sources will determine the future of lighting technology.

The performance of such devices is greatly dependent on the chemical composition of the used phosphors. These could be silicates, phosphates, oxides, aluminates, nitrides or oxonitrides and their compounds [C. Ronda, Luminescence: From Theory to Application. Science. 2007, 260p]. The most effective of these are aluminate phosphors having a garnet structure activated by cerium (III) oxide and including yttrium, gadolinium and other rare earth elements oxides. They are denoted in the literature as YAG:Ce. The chemical composition of these phosphors satisfies the stoichiometric equation, $(Y+\Sigma Ln)_3(\Sigma Me^{3+})_5 O_{12}$ where Ln=Gd, Ce and one or more elements of the lanthanide group in combination with them;

$Me^{3+}$- aluminium or aluminium in combination with one or more elements of the Ga, In, Sc group. The ratio $$\frac{(Y + \sum Ln)}{\sum Me^{3+}}$$

is strictly fixed and equal to ⅗.

Ln-elements play differing roles in the luminescence properties of Ln-aluminium garnets. Cerium is the activator of luminescence, i.e. an atom whose optical transitions determine the color and its molar concentration regulates the brightness of luminescence;

Gd, Tb and Lu can shift the maximum of the luminescence spectrum in the long-wave (Gd, Tb) or short-wave (Lu) spectral regions (Ga, In, Sc play role a similar one of Lu);

Nd, Eu, Dy, Er, Ho, Tm play an auxiliary role which was noted in several patents but not quantified.

Optical properties of phosphors for solid-state light sources based on blue LEDs are generally described using the following main inputs:

maximum position in the luminescence spectrum (520-590 nm);

half-width of the 110-125 nm emission band;

colour temperature ($T_c$), which usually varies in the 2500-7000 K range (if this parameter is less than 4000 K the emission is known as 'warm white', if $T_c$=4000-5500 K the emission is termed 'standard white' and finally, when $T_c$>5500K, it is 'cold white');

colour coordinates (x and y);

colour rendering index;

brightness of luminescence, usually estimated by comparing with a standard (most often by comparing with specimens made by Nichia).

A broadband yellow-orange emitting phosphor based on a cerium-activated yttrium-aluminium garnet $(Y,Ce)_3Al_5O_{12}$ and its method of manufacture were first patented in 1967 by G. Blasse and A. Brile of Philips in several countries including the USA—U.S. Pat. No. 3,564,322 (U.S. Class: 313/468; Intern'l Class:C09K11/77) of 29.04.1967. The more complex compound $(Y,Gd,Ce)_3Al_5O_{12}$ with similar luminescence properties was described in the 1970s and is referred to in basic handbooks on luminescent materials [G. Blasse and B. C. Grabmaier, "Luminescent materials", Springer-Verlag, Berlin (1994); S. Shionoya. Phosphor Handbook/Science, (1998), 921 pp.].

Thirty years after G. Blasse, between 1998 and 2008, the Japanese company Nichia received a series of patents for a device consisting of a semiconductor InGaN heterojunction emitting light of wavelength 450-470 nm and covered by grains of a fluorescent substance having the structure of cerium-activated yttrium-aluminium garnet [U.S. Pat. No. 5,998,925(U.S. Class: 313/503; Intern'l Class:H01J001/62) of 7 Dec. 1997, U.S. Pat. No. 6,069,440 (U.S. Class: 313/486, 489; Intern'l Class:H01L 033/00) of 30 May 2000, U.S. Pat No. 6,608,332 (U.S. Class: 257/98) of 19 Aug. 2003, U.S. Pat. No. 6,614,179(U.S. Class: 353/512; Intern'l Class:H01L 33/00) of 19 Aug. 2003, U.S. Pat. No. 7,362,048 (U.S. Class: 313/512].

In all these patents, the authors examine the use of a compound whose composition fits the equation: $(Y_{1-x}\Sigma Ln_x)_3(Al_{1-a-b-c}Ga_a In_b)_5 O_{12}$, where yttrium, gadolinium and cerium along with Lu, Sm, La, Sc are the main rare earth elements mentioned.

After the first Japanese patent, a number of patent solutions appeared in the literature offering new compounds with a modified formula for the yttrium sub-lattice of the classic stoichiometric garnet compound with respect to the rare earth elements but retaining the generalised equation $A_3$-$B_5$—$O_{12}$. For example, for the terbium-lutetium garnet the authors of U.S. Pat. No. 6,630,077 (U.S. Class: 313/468; Intern'l Class: C09K11/27 of 7 Oct. 2003) included all 14 f-elements in the list of claimed lanthanides, classifying them by their functional effect into forming of phosphor crystal structure (Tb, Lu, La, Gd, Yb), activating (Ce) and auxiliaries (Pr, Nd, Sm, Eu, Dy, Ho, Er, Tm).

Some of the latest patent documents on yttrium-aluminium garnets are patent applications US 20080116422 (U.S. Class: 252/301.4R; Intern'l Class:C09K11/08) of 22 May 2008 and US 20080290355 (U.S. Class: 257/94; Intern'l Class: C09K11/08) of 27 Nov. 2008. The first relates to a compound whose formula has the form $[Y_{1-x-y-z-p-q}Gd_x Tb_y Yb_z Lu_p Ce_q]_3 A_{15} O_{12}$ and to which besides Gd, Ce, Lu, and Sm, Tb and Yb were added. In patent application US 20080290355 by the same authors, phosphor composition is given by the formula $[Y_{1-x-y-z-q}Gd_x Lu_y Yb_z Eu_q$+activator additives Ce,Pr,Dy,Er,Sm$]_3 Al_5 O_{12}$, where 9 of the 14 f-elements were included in the lanthanide group.

A new trend in phosphor technology for blue LEDs using yttrium-gadolinium garnet is synthesis of compounds by modifying a known composition by adding earlier unpatented substitutes for items 'A' and 'B'. These researches are based on information about the structural peculiarities of garnet minerals. In mineralogy, the term 'garnet' is applied to more than 10 minerals having the same crystal structure but differing in chemical composition. $Mg_3Al_3Si_3O_{12}$, $Ca_3Al_2Si_3O_{12}$, $Mn_3Al_2Si_3O_{12}$ in particular, are well known minerals. For the general case, the formula for minerals with a garnet structure is written as $A_3B_2(BO_4)_3=A_3B_5O_{12}$. Lanthanides, calcium, magnesium, manganese, iron etc, which can be termed ions of type 'A', have a dodecahedral coordination (coordination number 8). Type 'B' ions ($Si^{4+}$ and partially $Al^{3+}$, $Ga^{3+}$, $In^{3+}$, $Sc^{3+}$) have a tetrahedral coordination (coordination number 4). Aluminium ions surrounded by oxygen ions have an octahedral coordination (coordination number 6).

Taking these facts into consideration, patent application US20070272899 (U.S. Class: 252/301.4F; Intern'l Class: C09K11/08,77) of 29 Nov. 2007 presented a garnet structure substituting magnesium and silica for aluminium (2 aluminium ions $Al^{3+}$ for $Mg^{2+}$ and $Si^{4+}$) that fits the equation:

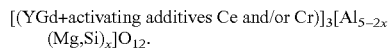

[(YGd+activating additives Ce and/or Cr)]$_3$[Al$_{5-2x}$(Mg,Si)$_x$]O$_{12}$.

Patent application US20070278451 (U.S. Class: 252/301.4R; Intern'l Class: C09K11/08,77) of 6Dec. 2007 proposes a two-phase compound $[BaAl_2O_4]_\alpha+[(Y+Ce,Pr,Eu,Dy,Tb,Mn,Ti/Fe)_3Al_5O_{12}]_\beta$ in which, according to the authors, formation of solid solutions is possible. Structural studies have shown that when phase 'α' constitutes up to 20% the specimens have a cubic structure while at higher contents a nonsystematic change in crystal structure type is observed. The available information on optical properties does not include data establishing a correlation between phosphor structure and lighting characteristics. Judging by the luminescence spectra cited for two specimens, the phosphors achieved a sufficiently high brightness and cold white luminescence corresponding to 5100 and 6800K.

A further development of this patent solution is patent application US 20080246005 ((U.S. Class: 252/301.4R; Intern'l Class:C09K11/77) of 9 Oct. 2008 whose authors suggest using solid solutions formed of yttrium-aluminium garnet $[(Y+Gd,Lu,Ce,Yb,Pr,Sm)_3Al_5O_{12}]_{1-x}$ and garnet of composition $\{[Mg(and/or\ Ca,Sr,Ba)_3[In(Ga,Sc)]_2Si_3O_{12}\}_x$ as phosphors for blue LEDs. In form this compound is the same as the one proposed in patent application US20070272899 (29 Nov. 2007) and is a mixed yttrium-aluminium-silica garnet with partial substitution of two atoms of Al(In,Ga,Sc) by Mg(Ca,Sr,Ba) and Si. The degree of substitution (x) did not exceed 15%.

Patent application US20090153027 (U.S. Class: 313/503; Intern'l Class:C09K11/78) of 19 Jun. 2009 is similar to the present invention and suggests a phosphor of composition $[Y_{2-x-y-z-q}Gd_xCe_yPr_zDy_pO_3]_{1,5\pm\alpha}+(Al_2O_3)_{2,5\pm\beta}$. The subject matter of the patent was to obtain a warm white emission by using a phosphor whose luminescence spectrum was shifted to the red field by introducing three activators, viz. cerium, praseodymium and disprosium, into the composition. In the description the authors do not even mention that the relationship between the sum of elements forming the yttrium and aluminium subsystems of the phosphor can favour the realisation of this objective. According to the authors, within the framework of the composition being patented [atomic fraction of Gd (0.001-0.4) Ce (0.01-0.2), Pr (0.0001-0.1), Dy (0.0001-0.1), as well as α(0.01-0.1) and β(0.01-0.1)] it is possible to change the colour coordinates at intervals x=0.405-0.515; y=0.355-0.550 at colour temperature 4000K and dominant wavelength in the spectrum equal to 565 nm. The effect achieved by using the three activators can be considered very trivial (see table showing behaviour of our phosphors).

At the same time, the role of variations in the index (fraction) of the lanthonides-aluminium sum in meeting the objective of the authors is not at all clear. It is all the more strange that emission performance of only one (from a lot possible) compound is reported, viz. $[Y_{2,66}Gd_{0,32}Ce_{0,03}Pr_{0,005}Dy_{0,0005}]Al_{5,02}O_{12,06}$, where the sum of elements (Y+ΣLn) is equal to 3.02.

Without any motivation the authors declare idea that the aluminium fraction (β) should not exceed '5' ("to increase the quantum efficiency of the phosphor according to the present invention, the anionic oxide fraction should not exceed 5.0 units"). But three lines later they say that when α=0, increase in β fraction by 0.01 results in changing of quantum efficiency by approximately 1%. (In this case it is first of all unclear how it has been measured and secondly, what techniques were used to achieve such accuracy.) On the other hand, the authors note that decrease in the α-fraction will lead to spectral narrowing, i.e. to reduction in the half-width of the luminescence band. The extent of effect on the indicated parameter is described by the value 0.5-0.8 nm for every 0.005 units of the α-fraction. The maximum shift observed by the authors was between 118 and 115 nm. This means that the maximum variation in α-fraction in the specimens studied by the authors was 0.03. According to the authors the preferred values are α=0.01 and β=0.03 ("according to the preferred embodiment of the present invention, the stable stoichiometric index <<α>> is . . . 0.01., the second index <<β>>, whose increment cannot exceed 0.03 mole fraction").

Taking into account this conclusion and also the absence of quantitative data relating to index effects on luminescence properties of phosphors, it is natural to question the correctness of including in the patented claims the upper values of α and β which were discovered to be equal to 0.1.

It should be specially emphasised that the preferred indices are practically the same as those they have indicated in U.S. Pat. No. 7,135,129 (U.S. Class: 252/301.4R; Intern'l Class: C09K11/08) of 14 Nov. 2006.

In its technical essence this patent comes closest to the invention put forward by us. The authors filed a patent claim for a phosphor of composition $[(Y_{1-x-y-z-q}Gd_xDy_yYb_zEr_q\-Ce_p)]_\alpha(Al_{1-n-m-k}Ga_nSc_kIn_l)_\beta O_{12}]$, with stoichiometric indices α=2.97-3.02 and β=4.98-5.02, differing from the conventional fractions 3 and 5 for yttrium aluminium garnet of stoichiometric composition.

The luminescent material was obtained through three-stage thermal processing of a mix of hydroxides of Gd, Y, Ce, Dy, Er, Yb, Al and Ga coprecipitated with ammonia from a mixed solution of nitrates of these metals. The precursors mixture was annealed in the presence of fluxes in a $H_2+3N_2$ gas mixture, initially at 500 K, then at 900-1100 K and finally at 1400- 1700 K, and then gradually cooled to 400 K. The obtained product was highly sintered after thermal processing and was grinded to particles of <1.5 μm.

The emission spectrum maximum of the patented luminescent material under blue LED excitation varied between 535 nm and 590 nm depending on the composition. White light generated by mixing a yellow-orange emitting phosphor with blue LED exhibited a colour temperature of 3000 K to 16000 K.

The purpose of this invention is to extend the range of inorganic luminescent materials for solid-state white-light sources.

This is achieved by creating an inorganic luminescent material for solid-state white-light sources based on blue-emitting InGaN LEDs that contains yttrium oxide, oxides of rare earth elements as well as aluminium oxide. The composition of the new inorganic luminescent material fits the general formula $(Y_{1-x-y}Ce_x\Sigma Ln_y)_{3+\alpha}Al_5O_{12+1.5\alpha}$, where $\Sigma Ln_y$=is one or more lanthanides from the Gd, Tb, La, Yb group, which together with yttrium and cerium form the yttrium sub-lattice.

In this case: y=1−x=p+q+r+s, where atomic fraction of gadolinium ($Gd_p$) 0.01<p<0.7; atomic fraction of terbium ($Tb_q$) 0.001<q<0.2; r,s—atomic fractions of lanthanum ($La)_r$ and ytterbium ($Yb)_s$ 0.001<r,s<0.1, while the difference for all the compositions [1−x−(p+q+r+s)]= [1−x−y]>0.

In addition to these elements the sub-lattice can contain, Sm, Lu, Pr, Nd.

For stoichiometric index (3+α) varying between 3.034 and 3.45, the proposed material is a phase of cubic structure. The lighting characteristics of this phase for a given composition of rare earth elements do not depend significantly on the stoichiometric value whereas for a given stoichiometric index variation in cation composition can lead to change in colour coordinates and spectral position of maximum in the 550-590 nm luminescence range. This allows varying the colour temperature of the solid-state white-light source between 2700 K and 4500 K.

Over the range 3.45<y $(Y_{1-x-y}Ce_x\Sigma Ln_y)_{3+\alpha}$<5, the proposed luminescent material is a two-phase composition in which one phase $(Y_{1-x-y}Ce_x\Sigma Ln_y)_{3.45}Al_5O_{12.67}$ has cubic structure while the other $(Y_{1-x-y}Ce_x\Sigma Ln_y)_5Al_5O_{15}$ is the orthorhombic modification of yttrium aluminate doped with Gd, Tb, La, Yb and activated with cerium. For a given cation composition the lighting characteristics of specimens, including two-phases, are determined by the value of (3+α) that regulates the relationship between cubic and orthorhombic phases. As result, the color temperature of the solid-state white-light source can vary between 3000 K and 6000 K depending on the composition.

Our investigations showed that the lighting characteristics of phosphors whose composition fits the general formula $(Y_{1-x-y}\Sigma Ln_y)_{3+\alpha}Al_5O_{12+1.5\alpha}$ are similar or identical to the lighting characteristics of conventional yttrium-aluminium garnets of industrial standard and those synthesised by us, with variation α within the limits 0,03<α<2 (table 1). The lower limit of the indicated interval (α=0.033) meets the limit specified in the prototype while the upper limit fits the formula $(Y_{1-x-y}Ce_x\Sigma Ln_y)_5Al_5O_{15}$.

ILLUSTRATIVE EXAMPLES

The phosphors whose composition is given in the list of examples were obtained by thermal processing of mixed oxides of yttrium, cerium, gadolinium, terbium, lanthanum, ytterbium and aluminium hydroxide (or mixed hydroxides coprecipitated out of aqueous nitrate solutions). The prepared mixes were then annealed in the presence of fluxes which help to accelerate mass transfer by forming a liquid phase on the surface of the reacting solids:

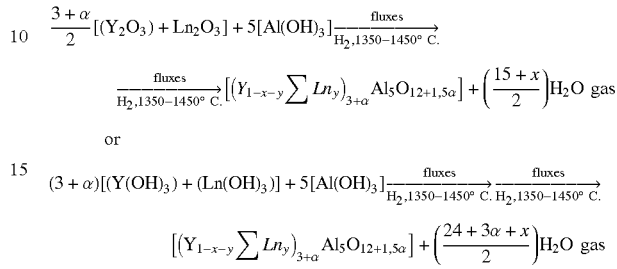

or $$(3+\alpha)[(Y(OH)_3) + (Ln(OH)_3)] + 5[Al(OH)_3] \xrightarrow[H_2,1350-1450°\ C.]{\text{fluxes}} \xrightarrow[H_2,1350-1450°\ C.]{\text{fluxes}}$$

$$[(Y_{1-x-y}\sum Ln_y)_{3+\alpha}Al_5O_{12+1.5\alpha}] + \left(\frac{24+3\alpha+x}{2}\right)H_2O\ \text{gas}$$

where increase in water quantity by x/2, where x is number of moles in $CeO_2$ in the parent oxide mix, is linked to reduction of $CeO_2$ to $Ce_2O_3$ in hydrogen.

Mixes of barium chloride and fluoride (up to 7-10% of oxide mass), aluminium and ammonium fluoride (<1%) in the presence of small quantities of boric acid (<0.5%) were used as fluxes.

The raw materials (lanthanide oxides and aluminium hydroxide) with known distribution of particles by sizes (measured with laser particle size analyser) were mixed in the dry state in a shaker or an eccentric mixer in covered polyethylene vessels using polyethylene-coated metal balls. Annealing was done in alundun crucibles ($Al_2O_3$) with heating of the reagents in a reducing medium ($N_2+H_2$) at the rate of 7-10 degrees/minute to 1350-1450° C. Duration of heat treatment at maximum temperature was 3-5 hours. Then the crucibles were cooled to 400° C. over 2.5 hours.

Investigation of the prepared phosphors showed that samples of stoichiometric garnet composition were quite strongly sintered. If index 3+α was >3.1, the average particle size after heat treatment was 3.5-5.0 microns without any grinding under condition of correct selection of precursors particle size.

The prepared samples were washed several times in a large quantity of distilled water to remove the fluxes and dried in a drying chamber at 150° C.

TABLE 1

Characteristics of the obtained phosphors:

| Phosphor composition: | I, | λ, | Properties of yellow-orange luminescence band (470-750 nm) | | | | Phase |
| --- | --- | --- | --- | --- | --- | --- | --- |
| | | | | Colour coordinates | | | |
| $(Y_{1-x}\Sigma Ln_x)_{3+\alpha}Al_5O_{12+1.5\alpha}$ | Rel. unit | nm | $\Delta\lambda_{0.5}$ | x | y | $T_c$, K | structure |
| Nichia-1: $(Y_{1-x}\Sigma Ln_x)_3 Al_5O_{12}$ | 100 | 570, | 122 | 0.3838 | 0.4367 | 4276 | Cubic |
| Nichia-2: $(Y_{1-x}\Sigma Ln_x)_3 Al_5O_{12}$ | 100 | 571 | 123 | 0.3974 | 0.4563 | 4089 | Cubic |
| $(Y_{0.847}Gd_{0.129}Ce_{0.024})_{3.00} Al_5O_{12}$ | 98 | 572 | 120 | 0.4079 | 0.4581 | 3899 | Cubic |
| | *96* | *576* | *121* | *0.409* | *0.404* | *3550* | |
| $(Y_{0.851}Gd_{0.127}Ce_{0.022})_{3.03} Al_5O_{12.045}$ | 99 | 572 | 122 | 0.4176 | 0.4672 | 3773 | Cubic |
| $(Y_{0.864}Gd_{0.115}Ce_{0.021})_{3.34} Al_5O_{12.465}$ | 101 | 571 | 120 | 0.3938 | 0.4439 | 4100 | Cubic |
| $(Y_{0.555}Gd_{0.4}La_{0.005}Ce_{0.04})_{3.5}$ | 82 | 567 | 130 | 0.4629 | 0.4987 | 3245 | Cubic |
| $Al_5O_{12.75}$ | *90* | *578* | *125* | *0.441* | *0.443* | *3260* | |
| | 80 | 578 | 125 | 0.419 | 0.366 | 2960 | Ortho-r = $\frac{10}{1,5}$ |

TABLE 1-continued

Characteristics of the obtained phosphors:

| Phosphor composition: | | Properties of yellow-orange luminescence band (470-750 nm) | | | | | Phase |
| --- | --- | --- | --- | --- | --- | --- | --- |
| | I, | λ, | | Colour coordinates | | | |
| $(Y_{1-x}\Sigma Ln_x)_{3+\alpha}Al_5O_{12+1.5\alpha}$ | Rel. unit | nm | $\Delta\lambda_{0.5}$ | x | y | $T_c$, K | structure |
| $(Y_{0.95}Gd_{0.01}Ce_{0.04})_{3.5}Al_5O_{12.75}$ | 100 | 564 | 123 | 0.4052 | 0.5331 | 4279 | Cubic |
| | *100* | *564* | *118* | *0.399* | *0.452* | *4050* | Ortho-r = $\frac{10}{0.6}$ |
| $(Y_{0.955}Yb_{0.005}Ce_{0.04})_{4.00}Al_5O_{13.5}$ | 82 | 564 | 118 | 0.363 | 0.400 | 4550 | Cubic Ortho-r = $\frac{10}{5.5}$ |
| $(Y_{0.95}Tb_{0.01}Ce_{0.04})_{5.00}Al_5O_{15}$ | 70 | 564 | 114 | 0.348 | 0.3761 | 4950 | Cubic Ortho-r = $\frac{3.3}{10}$ |

$I_{rel. unit}$—relative brightness; $\lambda_{max}$, nm—luminescence spectrum maximum; $\Delta\lambda_{0.5}$, nm—width of luminescence band at half-width of maximum ordinate; $T_c$—colour temperature, K Example No. 1

Synthesis of composition $(Y_{0.847}Gd_{0.129}Ce_{0.024})_{3.00}Al_5O_{12}$ using $Y_2O_3$, $Gd_2O_3$, $CeO_2$ and $Al(OH)_3$ as precursors. Annealing temperature 1400° C. Duration of heat treatment—3.5 hours.

Example No. 2

Synthesis of composition $(Y_{0.851}Gd_{0.127}Ce_{0.022})_{3.03}Al_5O_{12.045}$. The reacting mixture was prepared by coprecipitation of hydroxides. Annealing temperature 1350° C. Duration of heat treatment—3.5 hours.

Example No. 3

Synthesis of composition $(Y_{0.864}Gd_{0.115}Ce_{0.021})_{3.34}Al_5O_{12.465}$ using $Y_2O_3$, $Gd_2O_3$, $CeO_2$ and $Al(OH)_3$ as raw substances. Annealing temperature—1400° C. Duration of heat treatment—3.5 hours.

Example No. 4

Synthesis of composition $(Y_{0.555}Gd_{0.4}La_{0.005}Ce_{0.04})_{3.5}Al_5O_{12.75}$ using $Y_2O_3$, $Gd_2O_3$, $La_2O_3$, $CeO_2$ and $Al(OH)_3$ as raw substances. Annealing temperature—1450° C. Duration of heat treatment—3.5 hours.

Example No. 5

Synthesis composition $(Y_{0.95}Gd_{0.01}Ce_{0.04})_{3.5}Al_5O_{12.75}$ using $Y_2O_3$, $Gd_2O_3$, $CeO_2$ and $Al(OH)_3$ as precursors. Annealing temperature—1450° C. Duration of heat treatment—4 hours.

Example No. 6

Synthesis of composition $(Y_{0.955}Yb_{0.005}Ce_{0.04})_{4.00}Al_5O_{13.5}$ using $Y_2O_3$, $Yb_2O_3$, $CeO_2$ and $Al(OH)_3$ as raw substances. Annealing temperature—1450° C. Duration of heat treatment—4 hours.

Example No. 7

Synthesis of composition $(Y_{0.95}Tb_{0.01}Ce_{0.04})_{5.00}Al_5O_{15}$ using $Y_2O_3$, $Tb_4O_7$, $CeO_2$ and $Al(OH)_3$ as raw substances. Annealing temperature—1450° C. Duration of heat treatment—5 hours.

The lighting characteristics of specimens 1-7 were measured on certified equipment using two methods. In the first method, white light emission spectra were recorded while blue light emission was reflected from synthesised yellow-orange phosphor powders. In the second method the spectra were recorded after the blue emission passed through an organic matrix with dispersed phosphor, i.e. under conditions that imitate the functioning of white LED lamps based on blue-emitting LEDs. Spectral measurements made using the second method are presented in table 1 in italics. For the purpose of comparison data on lighting characteristics of industrial phosphor specimens produced by Nichia are also given in the same table.

X-ray phase analysis of the specimens showed that in the index range of $3+\alpha$ from 3 to (3.4÷3.5) there exists a cubic structure phase, whose homogeneity is retained despite significant deviation of the index from the limit value of classic garnet $A_3B_5O_{12}$, for which '3' is considered the strictly fixed index.

Analysis of data from the literature on the crystal structure of another yttrium-aluminium-oxygen compound, viz. $YAlO_3$ ($Y_5Al_5O_{15}$), showed that depending on the fabrication conditions, it can have an orthorhombic, hexagonal or cubic structure [S. Mathur, H. Shen a.o.: J. of Material Chemistry. 2004]. The lattice parameter of the cubic phase (Selected Powder Diffraction Data, JCPDS, file 38-0222) and diffractional reflections for the set of hkl indices coincide with $Y_3Al_5O_{12}$ despite significant difference in the yttrium-aluminium ratio.

Thus, the non-stoichiometric phase $(Y_{1-x-y}\Sigma Ln_y)_{3+\alpha}Al_5O_{12+1.5\alpha}$, whose composition fits index variation from 3 to 3.45, can be considered as a homogenous solid solutions between $Y_3Al_5O_{15}$ and cubic yttrium aluminate $Y_5Al_5O_{15}$. Taking into account the similarity in structure and the fact that the lattice parameters of both aluminates coincide, variation of $(3+\alpha)$ index (at given composition of yttrium sub-lattice and fixed cerium concentration) does not lead to perceptible change in brightness of the yellow-orange luminescence, position of maximum band in spectrum, color coordinates and color temperature (see table of experimental data).

According to the results of the x-ray phase analysis, at $(3+\alpha)>3.5$ the system becomes a two-phase system. The transition to the two-phase region is marked by the appearance of a set of reflections from the orthorhombic modification $YAlO_3$. The luminescence brightness in the index interval 3.5 to 4.5 decreased by less than 20-25% as compared to the cubic phase. The right-hand column of the table shows data on the proportion of the cubic and orthorhombic phases, which was taken as equal to the ratio of intensities of 100% reflections from each of the phases (cubic: d=2.707, hkl[420]; orthorhombic: d=2.617, hkl[121]). A specimen with composition $(Y_{0,95}Tb_{0,01}Ce_{0,04})_5Al_5O_{15}$ was also two-phase because of the simultaneous presence of cubic and orthorhombic modifications of doped yttrium-aluminium.

While recording the total emission spectrum of a white-light source when a blue emission is reflected from the phosphor surface, the relationship of the maxima of blue and yellow-orange emission from a specimen with composition $(Y_{0,96}Ce_{0,04})_{4,00}Al_5O_{13,5}$ was about 3:1 and reached 6:1 for the case $(Y_{0,95}Tb_{0,01}Ce_{0,04})_5Al_5O_{15}$. As result the color temperature increased from 4278 to 15000 K. If the blue emission passes through a polymeric organic matrix with suspended phosphor forming a coating similar one of bulb white LED lamp, it is possible by changing of the thickness of absorbance layer or the phosphor concentration to completely "utilise" the blue emission and lower the white LED colour temperature to 4500-6000 K even in the case of $(Y_{0,95}Tb_{0,01}Ce_{0,04})_{5,00}Al_5O_{15}$ specimen.

Thus, luminescence materials in the $(Y-Ln)_3Al_5O_{12}$—$Y_5Al_5O_{15}$ system despite significant increase in the $$\frac{Y+Ln}{Al}$$

ratio from 0.604 to 1, possess luminescence properties comparable to those of specimens whose composition corresponds to stoichiometric garnet.

The invention claimed is:

1. An inorganic luminescent material for solid-state white-light sources based on InGaN blue LEDs and containing yttrium oxide, oxides of rare earth metals, and/or aluminum oxide, having the formula:

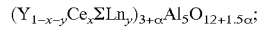

$$(Y_{1-x-y}Ce_x\Sigma Ln_y)_{3+\alpha}Al_5O_{12+1.5\alpha};$$

wherein α defines an increase in a stoichiometric index over a known value for yttrium-gadolinium garnet, wherein the increase in the stoichiometric index varies in the range of 0.033-2;

wherein x is an atomic fraction of cerium, equal to 0.0001-0.1;

wherein y is the sum of the atomic fractions of ($\Sigma Ln_y$) the lanthanides which together with yttrium and cerium form an yttrium sub-lattice which, in addition to yttrium and cerium, include gadolinium ($Gd_p$), terbium ($Tb_q$), lanthanum ($La_r$) and/or ytterbium ($Yb_s$), and y=p+q+r+s; and wherein the atomic fraction of gadolinium is in the range of 0.01<p<0.7, the atomic fraction of terbium is in the range of 0.001<q<0.2, r,s are the atomic fractions of lanthanum and ytterbium and are in the range of 0.001<r, s<0.1, while the difference for all the compositions [1−x−(p+q+r+s)]=[1−x−y]>0.

2. The inorganic luminescent material according to claim 1, wherein the stoichiometric index (3+α) varies between 3.034 and 3.45, wherein the material is a phase of cubic structure; and wherein the lighting characteristics of this phase for a given composition of rare earth elements do not substantially depend on the stoichiometric value whereas for a given stoichiometric index variation in cation composition can lead to change spectral position of maximum in the 550-590 nm luminescence range, thus permitting the changing of the color temperature of the solid-state white-light source between 2700 K and 4500 K.

* * * * *